United States Patent
Oota

(10) Patent No.: US 12,415,730 B2
(45) Date of Patent: Sep. 16, 2025

(54) CARBON NANOTUBE WATER DISPERSION, CONDUCTIVE FILM, ELECTRODE, AND SOLAR CELL AND METHOD OF PRODUCING SAME

(71) Applicant: ZEON CORPORATION, Tokyo (JP)

(72) Inventor: Ryuji Oota, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 18/043,909

(22) PCT Filed: Aug. 25, 2021

(86) PCT No.: PCT/JP2021/031242
§ 371 (c)(1),
(2) Date: Mar. 3, 2023

(87) PCT Pub. No.: WO2022/064939
PCT Pub. Date: Mar. 31, 2022

(65) Prior Publication Data
US 2024/0025749 A1    Jan. 25, 2024

(30) Foreign Application Priority Data
Sep. 24, 2020 (JP) .................. 2020-160189

(51) Int. Cl.
*C01B 32/174* (2017.01)
*C01B 32/159* (2017.01)
*H10F 77/20* (2025.01)

(52) U.S. Cl.
CPC .......... *C01B 32/174* (2017.08); *C01B 32/159* (2017.08); *H10F 77/211* (2025.01)

(58) Field of Classification Search
CPC ........................... H10F 77/211; C01B 32/159
See application file for complete search history.

(56) References Cited

U.S. PATENT DOCUMENTS

| | | | |
|---|---|---|---|
| 2013/0319512 A1 | 12/2013 | Obana et al. | |
| 2015/0072145 A1* | 3/2015 | Kamimura | H01M 4/483 |
| | | | 252/502 |
| 2017/0140878 A1 | 5/2017 | Yoshiwara | |
| 2022/0098354 A1 | 3/2022 | Yoshiwara et al. | |

FOREIGN PATENT DOCUMENTS

| | | | | |
|---|---|---|---|---|
| CN | 103426498 A | * | 12/2013 | ........... H01B 1/24 |
| CN | 110993144 A | * | 4/2020 | ........... H01B 1/22 |
| CN | 111293311 A | * | 6/2020 | ...... H01M 10/0525 |
| JP | 2006004836 A | | 1/2006 | |

(Continued)

OTHER PUBLICATIONS

Oct. 19, 2021, International Search Report issued in the International Patent Application No. PCT/JP2021/031242.

(Continued)

*Primary Examiner* — Khanh T Nguyen
(74) *Attorney, Agent, or Firm* — KENJA IP LAW PC

(57) ABSTRACT

A carbon nanotube water dispersion contains single-walled carbon nanotubes, acetylene black, a dispersant, and water. The content ratio of the single-walled carbon nanotubes and the acetylene black in the carbon nanotube water dispersion, in terms of a mass ratio of acetylene black/single-walled carbon nanotubes, is 1.4 or less.

12 Claims, 1 Drawing Sheet

(56) References Cited

FOREIGN PATENT DOCUMENTS

| JP | 2013251214 A | | 12/2013 | |
|---|---|---|---|---|
| KR | 20190093174 A | * | 8/2019 | ........ H01M 10/0525 |
| WO | 2015190108 A1 | | 12/2015 | |
| WO | 2020067429 A1 | | 4/2020 | |
| WO | 2020158507 A1 | | 8/2020 | |
| WO | 2020170154 A1 | | 8/2020 | |

OTHER PUBLICATIONS

Mar. 28, 2023, International Preliminary Report on Patentability issued in the International Patent Application No. PCT/JP2021/031242.

Hakan Durmaz et al., Synthesis and Characterization of Pyrene Bearing Amphiphilic Miktoarm Star Polymer and Its Noncovalent Interactions with Multiwalled Carbon Nanotubes, Journal of Polymer Science Part A: Polymer Chemistry, 2012, pp. 2406-2414, vol. 50, Issue 12, XP093215587.

Marco Liebscher et al., Impact of the molecular architecture of polycarboxylate superplasticizers on the dispersion of multi-walled carbon nanotubes in aqueous phase, Journal of Materials Science, 2017, pp. 2296-2307, vol. 52, XP036555340.

Oct. 28, 2024, the Extended European Search Report issued by the European Patent Office in the corresponding European Patent Application No. 21872071.2.

* cited by examiner

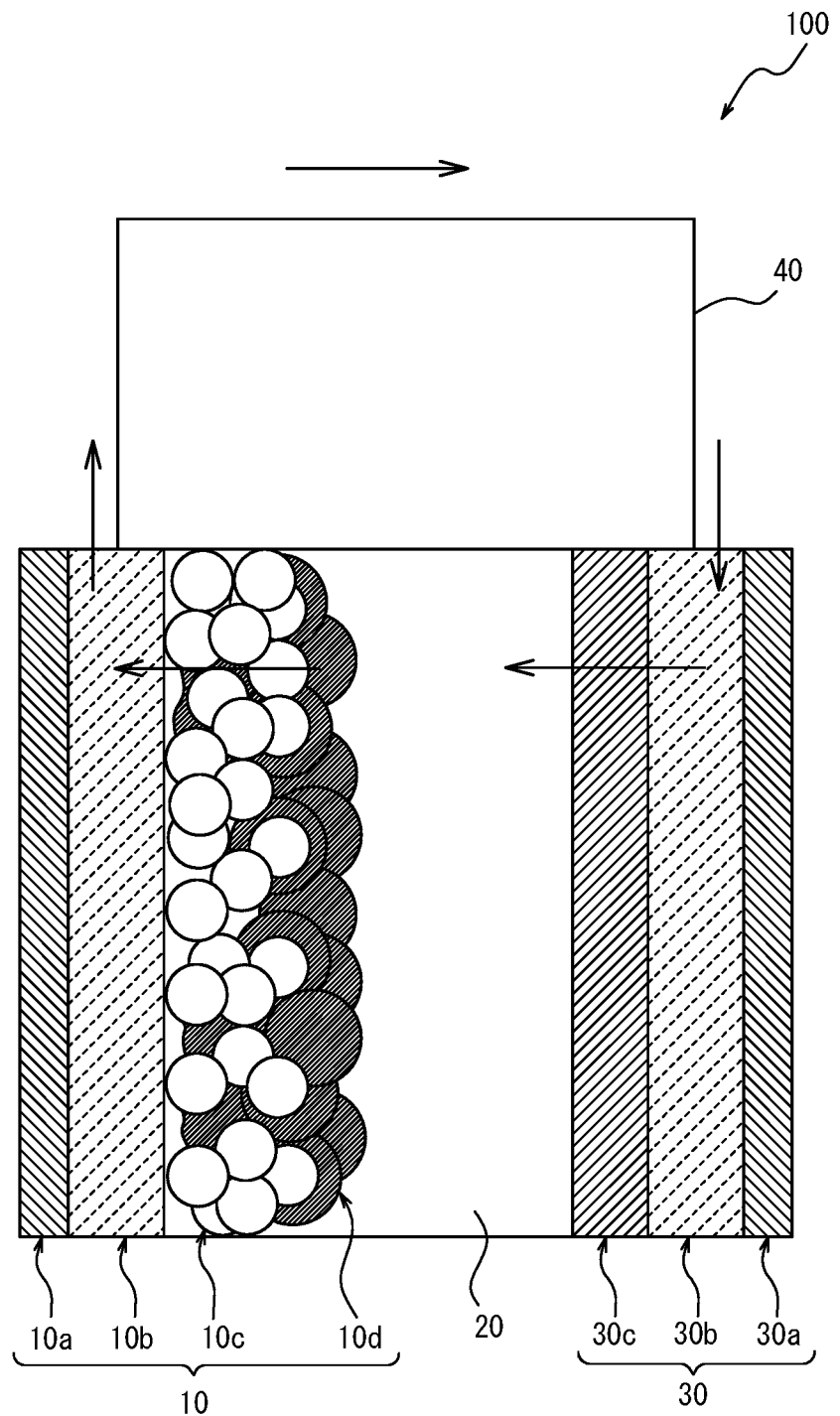

CARBON NANOTUBE WATER DISPERSION, CONDUCTIVE FILM, ELECTRODE, AND SOLAR CELL AND METHOD OF PRODUCING SAME

TECHNICAL FIELD

The present disclosure relates to a carbon nanotube water dispersion, a conductive film, an electrode, and a solar cell and method of producing the same.

BACKGROUND

A variety of industrial applications have been investigated for carbon nanotubes (hereinafter, also referred to as "CNTs") due to CNTs excelling in terms of various characteristics such as electrical conductivity, thermal conductivity, and mechanical strength. For example, techniques for forming conductive films using CNTs have been studied with focus on the excellent electrical conductivity of CNTs. Such conductive films are used in the production of electrodes of solar cells such as dye-sensitized solar cells, organic thin-film solar cells, and perovskite solar cells. As one example, a CNT-containing conductive film has been used in a dye-sensitized solar cell as a catalyst layer that is included in a counter electrode for a photoelectrode.

For example, Patent Literature (PTL) 1 discloses a catalyst layer that contains carbon nanotubes satisfying specific attributes and conductive carbon differing from the carbon nanotubes. In more detail, PTL 1 specifically studies a dye-sensitized solar cell that uses a counter electrode including, as a catalyst layer, a conductive film that is formed using a water dispersion containing single-walled carbon nanotubes and Ketjenblack.

Moreover, although CNTs are not used, the formation of a catalyst layer using carbon black and a fibrous carbon material as conductive carbon materials is studied in PTL 2, for example. PTL 2 actually discloses a photoelectric conversion element including a counter electrode that contains carbon black, a fibrous carbon material, and an organic binder and in which the contained mass A of the carbon black and the fibrous carbon material B have a mass ratio (B/A) that is within a range of not less than 10/90 and not more than 50/50. In more detail, PTL 2 specifically studies a dye-sensitized solar cell including a counter electrode that includes, as a catalyst layer, a conductive film obtained by mixing carbon black, vapor-grown carbon fiber, and polyvinylidene fluoride with N-methylpyrrolidone to obtain a slurry, applying the slurry onto a substrate surface, and drying the slurry.

CITATION LIST

Patent Literature

PTL 1: WO2015/190108A1
PTL 2: JP2013-251214A

SUMMARY

Technical Problem

However, there is room for further improvement of conductive films that have previously been studied in terms of electrical conductivity and also catalytic activity when the conductive film is used as a catalyst layer. There is also room for further improvement of the conventional conductive films described above in terms of energy conversion efficiency (hereinafter, also referred to simply as "conversion efficiency") of an obtained solar cell.

Accordingly, one object of the present disclosure is to provide a carbon nanotube water dispersion with which it is possible to form a conductive film that has excellent electrical conductivity, that has excellent catalytic activity when used as a catalyst layer, and that can cause a solar cell to display excellent conversion efficiency.

Another object of the present disclosure is to provide a conductive film that has excellent electrical conductivity, that has excellent catalytic activity when used as a catalyst layer, and that can cause a solar cell to display excellent conversion efficiency.

Another object of the present disclosure is to provide an electrode that can cause a solar cell to display excellent conversion efficiency.

Another object of the present disclosure is to provide a solar cell having excellent conversion efficiency and a method of producing the same.

Solution to Problem

The inventor conducted diligent investigation to achieve the objects set forth above. First, the inventor discovered that among carbon nanotubes, the use of single-walled carbon nanotubes results in a conductive film having excellent catalytic activity as a catalyst layer. However, it became clear to the inventor through further studies that in the case of a conductive film that is formed using a carbon nanotube water dispersion obtained through compounding of single-walled carbon nanotubes, there is room for improvement in terms of electrical conductivity. The inventor then made a new discovery that when acetylene black is compounded in addition to single-walled carbon nanotubes in production of a carbon nanotube water dispersion, this carbon nanotube water dispersion can be used to form a conductive film having not only excellent catalytic activity, but also excellent electrical conductivity, and that conversion efficiency can be increased when a solar cell is then also formed. In this manner, the inventor completed the present disclosure.

Specifically, the present disclosure aims to advantageously solve the problems set forth above, and a presently disclosed carbon nanotube water dispersion comprises: one or more single-walled carbon nanotubes; acetylene black; a dispersant; and water, wherein a content ratio of the single-walled carbon nanotubes and the acetylene black, in terms of a mass ratio of acetylene black/single-walled carbon nanotubes, is 1.4 or less. Through a carbon nanotube water dispersion in which the content ratio of single-walled carbon nanotubes and acetylene black, in terms of mass ratio of acetylene black/single-walled carbon nanotubes, is 1.4 or less, it is possible to form a conductive film that has excellent electrical conductivity, that has excellent catalytic activity when used as a catalyst layer, and that can cause a solar cell to display excellent conversion efficiency.

The presently disclosed carbon nanotube water dispersion preferably further comprises a thickener. When the carbon nanotube water dispersion contains a thickener, the conversion efficiency of an obtained solar cell can be even further improved.

In the presently disclosed carbon nanotube water dispersion, the dispersant and the thickener are preferably each formed of a non-ionic polymer. By using a non-ionic polymer as the dispersant and also using a non-ionic polymer as the thickener, it is possible to increase the film strength of a conductive film and to further increase the conversion efficiency of an obtained solar cell.

In the presently disclosed carbon nanotube water dispersion, the dispersant is preferably a copolymer of styrene and methoxy polyethylene glycol methacrylate. By using a copolymer of styrene and methoxy polyethylene glycol methacrylate as the dispersant, it is possible to even further improve the conversion efficiency of a solar cell.

Moreover, the present disclosure aims to advantageously solve the problems set forth above, and a presently disclosed conductive film is obtained using any one of the carbon nanotube water dispersions set forth above. A conductive film that is formed from the CNT water dispersion set forth above has excellent electrical conductivity, has excellent catalytic activity when used as a catalyst layer, and can cause a solar cell to display excellent conversion efficiency.

Furthermore, the present disclosure aims to advantageously solve the problems set forth above, and a presently disclosed electrode comprises the conductive film set forth above. An electrode that includes the conductive film set forth above can cause a solar cell to display excellent conversion efficiency. The presently disclosed electrode can suitably be used as a counter electrode.

Also, the present disclosure aims to advantageously solve the problems set forth above, and a presently disclosed solar cell comprises the electrode set forth above. A solar cell that includes the electrode set forth above has excellent conversion efficiency.

Moreover, the present disclosure aims to advantageously solve the problems set forth above, and a presently disclosed method of producing a solar cell is a method of producing a solar cell having a first electrode, an electrolyte layer, and a second electrode in a stacked arrangement in stated order, comprising: a step of applying any one of the carbon nanotube water dispersions set forth above onto a substrate and performing drying thereof to form a conductive film and form a first electrode that includes the conductive film; and a step of using an electrolyte solution containing a polar aprotic substance as a solvent to form an electrolyte layer between the first electrode and a second electrode. Through the presently disclosed method of producing a solar cell, it is possible to efficiently produce the presently disclosed solar cell.

In the presently disclosed method of producing a solar cell, the dispersant that is contained in the carbon nanotube water dispersion is preferably soluble in the solvent that is contained in the electrolyte solution. When the dispersant that is contained in the carbon nanotube water dispersion is soluble in the solvent that is a constituent of the electrolyte solution, it is possible to even further increase the photoelectric conversion efficiency of an obtained solar cell because the dispersant, which constitutes a resistive component contained in a conductive film, elutes into the electrolyte solution inside the solar cell and thus can be removed from the conductive film.

Note that when a certain compound (dispersant or thickener) is said to be "soluble" in a solvent (polar aprotic substance) in the present specification, this means that the compound dissolves (insoluble matter is not visually observable) in the solvent with a concentration of 1 mass % at a temperature of 23° C., and when a certain compound is said to be "insoluble", this means that the compound does not dissolve (insoluble matter is visually observable) in the solvent with a concentration of 1 mass % at a temperature of 23° C. even after 24 hours of stirring.

In the presently disclosed method of producing a solar cell, it is preferable that the carbon nanotube water dispersion further contains a thickener, and that the thickener is insoluble in the solvent that is contained in the electrolyte solution. When a thickener that is contained in the carbon nanotube water dispersion is insoluble in the solvent that is a constituent of the electrolyte solution, the thickener displays binding capacity in a conductive film that is incorporated into a solar cell, inhibits detachment of the conductive film from a substrate, and, as a result, can improve the conversion efficiency of the obtained solar cell.

In the presently disclosed method of producing a solar cell, the polar aprotic substance may be one or more selected from the group consisting of acetonitrile, γ-butyrolactone, 3-methoxypropionitrile, and triethylene glycol monomethyl ether.

Advantageous Effect

According to the present disclosure, it is possible to provide a carbon nanotube water dispersion with which it is possible to form a conductive film that has excellent electrical conductivity, that has excellent catalytic activity when used as a catalyst layer, and that can cause a solar cell to display excellent conversion efficiency.

Moreover, according to the present disclosure, it is possible to provide a conductive film that has excellent electrical conductivity, that has excellent catalytic activity when used as a catalyst layer, and that can cause a solar cell to display excellent conversion efficiency.

Furthermore, according to the present disclosure, it is possible to provide an electrode that can cause a solar cell to display excellent conversion efficiency.

Also, according to the present disclosure, it is possible to provide a solar cell having excellent conversion efficiency and a method of producing the same.

BRIEF DESCRIPTION OF THE DRAWING

In the accompanying drawing,

FIG. 1 illustrates schematic configuration of one example of a dye-sensitized solar cell.

DETAILED DESCRIPTION

The presently disclosed carbon nanotube water dispersion (CNT water dispersion) can be used in an application of producing an electrode of a solar cell such as a dye-sensitized solar cell, an organic thin-film solar cell, or a perovskite solar cell, and, more specifically, can be used to form a conductive film that is included in a counter electrode. Moreover, the presently disclosed conductive film is formed using the presently disclosed carbon nanotube water dispersion. Furthermore, the presently disclosed electrode includes the presently disclosed conductive film. Also, the presently disclosed solar cell includes the presently disclosed electrode can be efficiently produced by the presently disclosed method of producing a solar cell.

(Carbon Nanotube Water Dispersion)

The presently disclosed CNT water dispersion contains one or more single-walled carbon nanotubes, acetylene black, a dispersant, and water, and may further contain other components as necessary. The content ratio of the single-walled carbon nanotubes and the acetylene black in the carbon nanotube water dispersion, in terms of a mass ratio of acetylene black/single-walled carbon nanotubes, is required to be 1.4 or less.

By using the presently disclosed CNT water dispersion, it is possible to form a conductive film that has excellent electrical conductivity, that has excellent catalytic activity when used as a catalyst layer, and that can cause a solar cell to display excellent conversion efficiency.

<Single-Walled Carbon Nanotubes>

Single-walled CNTs have a large value for specific surface area relative to quantity compared to multi-walled CNTs. Consequently, single-walled CNTs can increase the catalytic activity as a catalyst layer of a conductive film that contains the single-walled CNTs. One type of single-walled CNTs may be used individually, or two or more types of single-walled CNTs may be used in combination.

The average diameter of the single-walled CNTs is preferably 1 nm or more, and more preferably 2 nm or more, and is preferably 10 nm or less, and more preferably 6 nm or less. When the average diameter of the single-walled CNTs is 1 nm or more, dispersibility of the single-walled CNTs can be increased, and characteristics such as electrical conductivity can be stably imparted to a conductive film. Moreover, when the average diameter of the single-walled CNTs is 10 nm or less, it is possible to even further increase the catalytic activity of a conductive film in a situation in which the conductive film is used as a catalyst layer.

Note that the "average diameter of carbon nanotubes" referred to in the present disclosure can be determined by measuring the diameters (outer diameters) of 20 CNTs, for example, in a transmission electron microscope (TEM) image and then calculating a number-average value of the diameters.

The single-walled CNTs are preferably CNTs for which a ratio ($3\sigma/Av$) of a value ($3\sigma$) obtained by multiplying the diameter standard deviation ($\sigma$: sample standard deviation) of the CNTs by 3 relative to the average diameter (Av) of the CNTs is more than 0.20 and less than 0.80, more preferably single-walled CNTs for which $3\sigma/Av$ is more than 0.25, and particularly preferably CNTs for which $3\sigma/Av$ is more than 0.40. By using single-walled CNTs for which $3\sigma/Av$ is more than 0.20 and less than 0.80, it is possible to further improve the performance of a produced conductive film.

Note that the average diameter (Av) and the standard deviation ($\sigma$) of the single-walled CNTs may be adjusted by altering the production method or production conditions of the single-walled CNTs or may be adjusted by combining a plurality of types of single-walled CNTs that have been obtained by different production methods.

The CNTs that are typically used take a normal distribution when a plot is made of diameter measured as described above on a horizontal axis and probability density on a vertical axis, and a Gaussian approximation is made.

The average length of the single-walled CNTs is preferably 10 μm or more, more preferably 50 μm or more, and particularly preferably 80 μm or more, and is preferably 600 μm or less, more preferably 500 μm or less, and particularly preferably 400 μm or less. When the average length is 10 μm or more, electrical conduction paths can be formed in a conductive film with a small amount of the single-walled CNTs, and strength of the conductive film is high. Moreover, when the average length is 600 μm or less, coatability onto a substrate during application of the dispersion can be improved. Therefore, setting the average length of the single-walled CNTs within any of the ranges set forth above can sufficiently reduce surface resistivity of a conductive film and impart high catalytic activity to the conductive film.

Note that the "average length of carbon nanotubes" referred to in the present disclosure can be determined by measuring the lengths of 20 single-walled CNTs, for example, in a scanning electron microscope (SEM) image and then calculating an arithmetic mean value of the lengths.

The single-walled CNTs normally have an aspect ratio of more than 10. Note that the aspect ratio of single-walled CNTs can be determined by measuring the diameters and lengths of 100 randomly selected single-walled CNTs using a scanning electron microscope or a transmission electron microscope and then calculating an average value of the ratio of diameter and length (length/diameter).

The BET specific surface area of the single-walled CNTs is preferably 400 $m^2/g$ or more, more preferably 600 $m^2/g$ or more, and even more preferably 800 $m^2/g$ or more, and is preferably 2,000 $m^2/g$ or less, more preferably 1,800 $m^2/g$ or less, and even more preferably 1,600 $m^2/g$ or less. When the BET specific surface area of the single-walled CNTs is 400 $m^2/g$ or more, dispersibility of the single-walled CNTs can be increased, and characteristics can be imparted to an obtained conductive film, such as electrical conductivity and also catalytic activity in a situation in which the conductive film is used in an electrode for a solar cell, with a small amount of the single-walled CNTs. Moreover, when the BET specific surface area of the single-walled CNTs is 2,000 $m^2/g$ or less, characteristics can be imparted to an obtained conductive film, such as electrical conductivity and also catalytic activity in a situation in which the conductive film is used in an electrode for a solar cell, and coatability of the CNT water dispersion can be stabilized.

The term "BET specific surface area" as used in the present disclosure refers to nitrogen adsorption specific surface area measured by the BET method.

The single-walled CNTs preferably have a radial breathing mode (RBM) peak when evaluated by Raman spectroscopy. Note that an RBM is not present in the Raman spectrum of CNTs having three or more walls.

A ratio (G/D ratio) of G band peak intensity relative to D band peak intensity in a Raman spectrum of the single-walled CNTs is preferably not less than 1.0 and not more than 100.0, and more preferably not less than 3.0 and not more than 50.0. When the G/D ratio is not less than 3.0 and not more than 50.0, characteristics can be imparted to an obtained conductive film, such as catalytic activity in a situation in which the conductive film is used in an electrode for a solar cell.

The single-walled CNTs can be produced by a known single-walled CNT synthesis method such as arc discharge, laser ablation, or chemical vapor deposition (CVD) without any specific limitations. More specifically, the single-walled CNTs can be efficiently produced, for example, in accordance with a method in which, during synthesis of CNTs by chemical vapor deposition (CVD) by supplying a feedstock compound and a carrier gas onto a substrate having a catalyst layer for CNT production at the surface thereof, a trace amount of an oxidant (catalyst activating material) is provided in the system in order to dramatically improve the catalytic activity of the catalyst layer (super growth method; refer to WO2006/011655A1). Hereinafter, carbon nanotubes that are obtained by the super growth method are also referred to as "SGCNTs".

An assembly of single-walled CNTs produced by the super growth method may consist solely of SGCNTs or may include, in addition to SGCNTs, other carbon nanostructures such as non-circular tube-shaped carbon nanostructures.

From a viewpoint of increasing the conversion efficiency of an obtained solar cell, the content ratio of the single-walled CNTs and acetylene black in the presently disclosed CNT water dispersion, in terms of a mass ratio of acetylene black/single-walled CNTs, is required to be 1.4 or less as previously described, and is preferably 1.0 or less. Note that the lower limit for the mass ratio (acetylene black/single-walled CNTs) is normally 0.1 or more.

Although no specific limitations are placed on the content of the single-walled CNTs in the CNT water dispersion, the content of the single-walled CNTs when the mass of the overall CNT water dispersion is taken to be 100 mass % is preferably 0.01 mass % or more, more preferably 0.1 mass % or more, and even more preferably 0.5 mass % or more, and is even more preferably 5.0 mass % or less, and particularly preferably 1.0 mass % or less.

<Acetylene Black>

Acetylene black is one type of carbon black that is obtained through thermal decomposition of acetylene gas and, in general, has a structure in which primary carbon fine particles of high purity and spherical shape are linked. The inclusion of acetylene black in addition to single-walled CNTs in the CNT water dispersion increases the electrical conductivity of an obtained conductive film. Although the reason for this is not clear, it is presumed that because acetylene black displays high electrical conductivity due to having high purity and a highly developed structure compared to other types of carbon black, a synergistic effect thereof with the single-walled CNTs is displayed, thereby enabling formation of a good electrical conduction network.

The CNT water dispersion contains acetylene black within a range such that the mass ratio thereof with the single-walled carbon nanotubes (acetylene black/single-walled carbon nanotubes) satisfies the ratio previously described in the "Single-walled carbon nanotubes" section. Accordingly, the content of acetylene black in the CNT water dispersion can be set as appropriate within a range such that the previously described mass ratio is satisfied based on the content of the single-walled CNTs.

The average primary particle diameter of the acetylene black is preferably 20 nm or more, and more preferably 22 nm or more, and is preferably 50 nm or less, and more preferably 49 nm or less. Note that the average particle diameter of acetylene black can be determined by measuring the diameters (outer diameters) of 20 primary particles of the acetylene black, for example, in a transmission electron microscope (TEM) image and then calculating a number-average value of the diameters. When the average particle diameter of the acetylene black is within any of the ranges set forth above, the electrical conductivity of an obtained conductive film can be even further increased.

The BET specific surface area of the acetylene black is preferably 20 $m^2/g$ or more, and more preferably 30 $m^2/g$ or more, and is preferably 300 $m^2/g$ or less, more preferably 200 $m^2/g$ or less, and even more preferably 150 $m^2/g$ or less. Note that the BET specific surface area of acetylene black can be measured in accordance with the BET method. When the BET specific surface area of the acetylene black is not less than any of the lower limits set forth above, it is possible to form a good electrical conduction network at a mass ratio of the acetylene black with the single-walled carbon nanotubes of 1.4 or less. Moreover, when the BET specific surface area of the acetylene black is not more than any of the upper limits set forth above, an electrical conduction network can be formed without significant thickening of the CNT water dispersion.

<Dispersant>

The dispersant may be a compound that can cause dispersion of the previously described single-walled CNTs in water without any specific limitations. For example, the dispersant may be a copolymer of styrene and methoxy polyethylene glycol methacrylate, polyvinylpyrrolidone, a polyoxyethylene alkyl ether (preferably having an alkyl group carbon number of not less than 8 and not more than 20), or a polyoxyethylene alkylphenyl ether (preferably having an alkyl group carbon number of not less than 8 and not more than 9). Note that one dispersant may be used individually, or two or more dispersants may be used in combination.

Of these examples, a non-ionic polymer is preferable as the dispersant from a viewpoint of increasing the film strength of a conductive film and even further increasing the conversion efficiency of an obtained solar cell, with a copolymer of styrene and methoxy polyethylene glycol methacrylate or polyvinylpyrrolidone being more preferable, and a copolymer of styrene and methoxy polyethylene glycol methacrylate being even more preferable.

From a viewpoint of even further improving electrical conductivity of a conductive film and also catalytic activity when the conductive film is used as a catalyst layer, while also further increasing the conversion efficiency of a solar cell, n (integer) of an ethylene glycol chain section ($CH_2$—$CH_2$—$O$)$_n$ of a repeating unit derived from methoxy polyethylene glycol methacrylate in the copolymer of styrene and methoxy polyethylene glycol methacrylate is preferably not less than 2 and not more than 45, and more preferably not less than 9 and not more than 23.

Moreover, from a viewpoint of even further improving electrical conductivity of a conductive film and also catalytic activity when the conductive film is used as a catalyst layer, while also further increasing the conversion efficiency of a solar cell, the weight-average molecular weight of the copolymer of styrene and methoxy polyethylene glycol methacrylate is preferably not less than 10,000 and not more than 30,000.

Note that the weight-average molecular weight referred to in the present disclosure can be measured by gel permeation chromatography.

The presently disclosed CNT water dispersion can suitably be used for forming an electrode of a solar cell including an electrolyte solution that contains a polar aprotic substance as a solvent, and, in this situation, it is preferable to use a dispersant that is soluble in the aforementioned solvent. When the dispersant is soluble in the solvent, it is possible to even further increase the photoelectric conversion efficiency of the solar cell because the dispersant, which constitutes a resistive component contained in a conductive film, elutes into the electrolyte solution inside the solar cell and thus can be removed from the conductive film.

Examples of polar aprotic substances that can be used as a solvent of an electrolyte solution include five-membered-ring cyclic carbonates such as ethylene carbonate and propylene carbonate; five-membered-ring cyclic esters such as γ-butyrolactone and γ-valerolactone; aliphatic nitriles such as acetonitrile, 3-methoxypropionitrile, and methoxyacetonitrile; aliphatic chain ethers such as dimethoxyethane and triethylene glycol monomethyl ether; alicyclic ethers such as tetrahydrofuran and dioxane; aliphatic sulfones such as ethyl isopropyl sulfone; cyclic sulfones such as sulfolane; aliphatic sulfoxides such as dimethyl sulfoxide; dimethylformamide; and ethylmethylimidazolium bis(trifluoromethylsulfonyl)imide.

One of these polar aprotic substances may be used individually, or two or more of these polar aprotic substances may be used in combination. Of these polar aprotic substances, acetonitrile, γ-butyrolactone, 3-methoxypropionitrile, and triethylene glycol monomethyl ether are preferable.

Examples of dispersants that are soluble in at least acetonitrile, γ-butyrolactone, and 3-methoxypropionitrile include the previously described copolymer of styrene and methoxy polyethylene glycol methacrylate, polyvinylpyrrolidone, polyoxyethylene alkyl ether (preferably having an alkyl group carbon number of not less than 8 and not more than 20), and polyoxyethylene alkylphenyl ether (preferably having an alkyl group carbon number of not less than 8 and not more than 9).

Moreover, examples of dispersants that are soluble in at least triethylene glycol monomethyl ether include a copolymer of styrene and methoxy polyethylene glycol methacrylate and polyvinylpyrrolidone.

Although no specific limitations are placed on the content of the dispersant in the CNT water dispersion, the content of the dispersant per 100 parts by mass of the above-described CNTs is preferably 50 parts by mass or more, and more preferably 100 parts by mass or more, and is preferably 500 parts by mass or less, and more preferably 300 parts by mass or less. When the content of the dispersant is within any of the ranges set forth above, it is possible to even further improve the electrical conductivity and film strength of a conductive film and also the catalytic activity when the conductive film is used as a catalyst layer, while also further increasing the conversion efficiency of a solar cell.

<Thickener>

A thickener that can optionally be added to the CNT water dispersion may be a compound that can impart viscosity to the CNT water dispersion without any specific limitations. When the CNT water dispersion contains a thickener, the conversion efficiency of an obtained solar cell can be even further improved. The thickener may, for example, be a cellulosic polymer (hydroxyethyl cellulose, carboxymethyl cellulose, etc.), polyethylene oxide, or polyvinyl alcohol. Note that one thickener may be used individually, or two or more thickeners may be used in combination.

Of these examples, a non-ionic polymer (polyethylene oxide, hydroxyethyl cellulose, etc.) is preferable as the thickener from a viewpoint of further improving the film strength of a conductive film and the conversion efficiency of a solar cell.

The presently disclosed CNT water dispersion can suitably be used for forming an electrode of a solar cell including an electrolyte solution that contains a polar aprotic substance as a solvent, and, in this situation, it is preferable to use a thickener that is insoluble in the aforementioned solvent. When a thickener that is contained in the CNT water dispersion is insoluble in a solvent that is a constituent of an electrolyte solution, the thickener displays binding capacity in a conductive film that is incorporated into a solar cell, inhibits detachment of the conductive film from a substrate, and, as a result, can improve the conversion efficiency of the solar cell.

Examples of thickeners that are insoluble in at least acetonitrile include cellulosic polymers (hydroxyethyl cellulose, carboxymethyl cellulose, etc.) and polyvinyl alcohol.

Moreover, examples of thickeners that are insoluble in at least γ-butyrolactone and 3-methoxypropionitrile include cellulosic polymers (hydroxyethyl cellulose, carboxymethyl cellulose, etc.), polyethylene oxide, and polyvinyl alcohol.

Furthermore, examples of thickeners that are insoluble in at least triethylene glycol monomethyl ether include cellulosic polymers (hydroxyethyl cellulose, carboxymethyl cellulose, etc.) and polyethylene oxide.

Although no specific limitations are placed on the content of the thickener in the CNT water dispersion, the content of the thickener per 100 parts by mass of the above-described CNTs is preferably 5 parts by mass or more, and more preferably 10 parts by mass or more, and is preferably 100 parts by mass or less, and more preferably 50 parts by mass or less. When the content of the thickener is within any of the ranges set forth above, it is possible to even further improve the electrical conductivity and film strength of a conductive film and also the catalytic activity when the conductive film is used as a catalyst layer, while also further increasing the conversion efficiency of a solar cell.

<Solvent>

It is necessary to use at least water as a solvent, though a mixed solvent of water and a solvent that is miscible with water may be used. Examples of solvents that are miscible with water include ethers (dioxane, tetrahydrofuran, methyl cellosolve, ethylene glycol dimethyl ether, ethylene glycol butyl ether, etc.), ether alcohols (ethoxyethanol, methoxyethoxyethanol, etc.), esters (methyl acetate, ethyl acetate, etc.), ketones (acetone, methyl isobutyl ketone, cyclohexanone, methyl ethyl ketone, etc.), alcohols (methanol, ethanol, isopropanol, propylene glycol, ethylene glycol, diacetone alcohol, phenol, etc.), lower carboxylic acids (acetic acid, etc.), amines (triethylamine, trimethanol amine, etc.), nitrogen-containing polar solvents (N,N-dimethylformamide, nitromethane, N-methylpyrrolidone, acetonitrile, etc.), and sulfur compounds (dimethyl sulfoxide, etc.). One of these solvents may be used individually, or two or more of these solvents may be used in combination.

<Other Components>

Examples of other components include inorganic materials such as silica, metal particles, binders, conductive additives, surfactants, defoamers, antioxidants, and preservatives. Known examples of these other components may be used as appropriate. Moreover, one of these other components may be used individually, or two or more of these other components may be used in combination.

<Production Method>

No specific limitations are placed on the method by which the CNT water dispersion is produced. For example, a water dispersion of single-walled CNTs can be obtained by performing known mixing/dispersing treatment with respect to the single-walled CNTs, acetylene black, dispersant, and other components that are used as necessary, in the presence of a solvent that includes water. The known mixing/dispersing treatment may, for example, be a method using a wet jet mill such as a nanomizer or an ultimizer, a high-pressure homogenizer, an ultrasonic disperser, a ball mill, a sand grinder, a dyno-mill, a spike mill, a DCP mill, a basket mill, a paint conditioner, a high-speed stirring device such as a Homo Mixer, or the like.

The temperature during the mixing/dispersing treatment is not specifically limited but is normally not higher than the boiling point of the solvent including water, preferably 60° C. or lower, and more preferably 40° C. or lower, and is preferably −10° C. or higher, and more preferably 0° C. or higher. When the temperature is within any of these ranges, the dispersibility of the single-walled CNTs can be improved.

The pH of the CNT water dispersion is not specifically limited but is preferably 0.1 or higher, more preferably 0.2 or higher, and particularly preferably 0.5 or higher, and is preferably lower than 7 (i.e., acidic), more preferably 6 or lower, even more preferably 5 or lower, further preferably 4 or lower, and particularly preferably 3 or lower. When the pH of the CNT water dispersion is within any of the ranges set forth above, stability of the CNT water dispersion can be increased.

Note that the pH of the CNT water dispersion can be lowered through addition of an acidic substance. The acidic substance may be sulfuric acid, hydrochloric acid, nitric acid, citric acid, oxalic acid, tartaric acid, formic acid, phosphoric acid, or the like, for example.

(Conductive Film)

The presently disclosed conductive film is formed using the presently disclosed CNT water dispersion set forth above. The presently disclosed conductive film has excellent electrical conductivity and has excellent catalytic activity when used as a catalyst layer as a result of being formed from the presently disclosed CNT water dispersion.

Moreover, the presently disclosed conductive film can suitably be used as a constituent member of an electrode (photoelectrode or counter electrode) of a solar cell, and, in particular, can suitably be used as a constituent member of a counter electrode.

<Properties>

The thickness of the presently disclosed conductive film is not specifically limited but is normally not less than 100 nm and not more than 1 mm. In a case in which the conductive film is used for an electrode of a solar cell (particularly a dye-sensitized solar cell), the thickness of the conductive film is preferably not less than 0.01 µm and not more than 100 µm, more preferably not less than 0.1 µm and not more than 20 µm, and even more preferably not less than 0.5 µm and not more than 10 µm. When the thickness of the conductive film is within any of the ranges set forth above, this provides excellent electrical conductivity and catalytic performance as an electrode and an excellent balance of overall series resistance and the like when a plurality of solar cells are connected to one another to obtain a solar cell module.

<Production Method>

No specific limitations are placed on the method by which the presently disclosed conductive film is produced so long as it is a method using the presently disclosed CNT water dispersion set forth above. For example, the presently disclosed conductive film can be produced through a step of applying the CNT water dispersion onto a substrate (application step) and a step of drying the CNT water dispersion on the substrate (drying step). Note that this production method may include steps other than the application step and the drying step (i.e., other steps).

<Application Step>

In the application step, the presently disclosed CNT water dispersion set forth above is applied onto a substrate.

The substrate can be selected as appropriate depending on the intended application without any specific limitations on the shape, constituent material, and size (thickness, etc.) thereof so long as the CNT water dispersion set forth above can be applied onto the substrate and an obtained conductive film can be mounted on the substrate. However, it is preferable to use a support that is used in the presently disclosed electrode described further below.

A known application method can be adopted as the method by which the CNT water dispersion is applied onto the substrate.

Examples of application methods that may be used include dipping, roll coating, gravure coating, knife coating, air knife coating, roll knife coating, die coating, screen printing, spray coating, gravure offset, inkjet, and atomization. Of these application methods, screen printing is preferable.

Application may be performed a number of times as necessary rather than just once, and two different application methods may be combined.

The coating thickness (wet thickness) during application of the CNT water dispersion onto the substrate is not specifically limited so long as electrical conductivity of the obtained conductive film is ensured but is preferably 0.001 µm or more, more preferably 0.005 µm or more, and particularly preferably 0.01 µm or more, and is preferably 500 µm or less, more preferably 300 µm or less, and particularly preferably 200 µm or less.

The coating weight of the CNTs per unit area of the substrate when the CNT water dispersion is applied onto the substrate is preferably 0.001 $mg/m^2$ or more, more preferably 0.005 $mg/m^2$ or more, and particularly preferably 0.01 $mg/m^2$ or more, and is preferably 50 $g/m^2$ or less, more preferably 10 $g/m^2$ or less, and particularly preferably 3 $g/m^2$ or less.

<Drying Step>

In the drying step, a coating film of the CNT water dispersion that has been formed on the substrate in the application step is dried so as to obtain a laminate that includes the substrate and a dry film of the CNT water dispersion.

A known drying method may be adopted as the method by which the CNT water dispersion is dried on the substrate without any specific limitations. Examples of such drying methods include air drying, heated drying such as hot-roll drying, drying under reduced pressure, infrared irradiation, photoirradiation with a xenon lamp, a flashlamp, or the like, and electromagnetic wave heating with microwaves or the like.

The drying temperature is not specifically limited so long as it is a temperature at which the solvent including water can be removed by vaporization and at which deformation of the substrate does not occur. The drying temperature is preferably 0° C. or higher, more preferably 15° C. or higher, even more preferably 25° C. or higher, and particularly preferably 80° C. or higher, and is preferably 250° C. or lower, more preferably 200° C. or lower, and particularly preferably 150° C. or lower.

The drying time is not specifically limited but is preferably 0.1 minutes or more, and is preferably 150 minutes or less.

The drying atmosphere may be a humidified atmosphere, air, an inert gas such as nitrogen or argon, a reduced pressure atmosphere such as a vacuum, or the like without any specific limitations.

<Other Steps>

Examples of other steps include, but are not specifically limited to, a step of washing the dried film of the CNT water dispersion that has been obtained through the above-described drying step using a washing solvent (washing step). In other words, the dry film of the CNT water dispersion that is obtained through the above-described drying step can be used in that form as the presently disclosed conductive film, or a dry film that has further undergone a washing step can be used as the presently disclosed conductive film.

By performing a washing step, it is possible to at least partially remove the dispersant that is contained in the dry film of the CNT water dispersion.

No specific limitations are placed on the washing solvent that is used in the washing step so long as it is a washing solvent that can remove the dispersant through contact with the dry film, and water or a polar aprotic substance such as previously described can be used as this washing solvent. In particular, in a case in which the presently disclosed CNT water dispersion contains a thickener in addition to the dispersant, it is preferable to use a polar aprotic substance such as previously described as the washing solvent from a viewpoint of even further increasing the photoelectric conversion efficiency of an obtained solar cell.

The washing can be performed by a known method such as application, immersion, or the like without any specific limitations so long as it is a technique that enables contact of the above-described washing solvent with the conductive film. Also note that the washing may be divided up into a plurality of washings. Moreover, drying may be performed by a known method after washing.

(Electrode)

The presently disclosed electrode includes the presently disclosed conductive film set forth above. Moreover, the presently disclosed electrode can cause a solar cell to display excellent conversion efficiency as a result of the presently disclosed electrode including the presently disclosed conductive film.

The presently disclosed electrode can be used as an electrode of a solar cell that includes a pair of electrodes (first electrode and second electrode). More specifically, the presently disclosed electrode may suitably be used as an electrode (photoelectrode or counter electrode) of a dye-sensitized solar cell, and particularly as a counter electrode of a dye-sensitized solar cell.

Although the presently disclosed electrode is described below using, as an example, a case in which the electrode is a counter electrode of a dye-sensitized solar cell and in which the counter electrode includes the presently disclosed conductive film as a catalyst layer, the presently disclosed electrode is not limited to the following example.

<Counter Electrode>

The counter electrode is an electrode for efficiently passing, to an electrolyte layer, electrons that have entered from an external circuit. The counter electrode includes, for example, a support, a conductive layer disposed on the support, and a catalyst layer disposed on the conductive layer. In one suitable configuration according to the present disclosure, the presently disclosed conductive film is used as the catalyst layer of the counter electrode as previously described.

<<Support>>

A known support can be used as the support of the counter electrode. More specifically, a support formed of a transparent resin or a support formed of glass can be used as the support of the counter electrode, and, in particular, a support formed of a transparent resin can preferably be used as the support of the counter electrode. Examples of transparent resins that may be used include synthetic resins such as cycloolefin polymer (COP), polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyethersulfone (PES), polyetherimide (PEI), and transparent polyimide (PI).

<<Conductive Layer and Catalyst Layer>>

A known conductive film can be used as the conductive layer of the counter electrode. Examples of known conductive films that may be used include a conductive film formed of an oxide such as indium tin oxide (ITO) or indium zinc oxide (IZO), a conductive film formed of a conductive polymer such as a polyaniline or a polythiophene (for example, PEDOT [poly(3,4-ethylenedioxythiophene)]/PSS (polystyrene sulfonate)), and a conductive film (other than the presently disclosed conductive film) containing conductive carbon such as natural graphite, activated carbon, artificial graphite, graphene, or CNTs.

The presently disclosed conductive film is preferably used as the catalyst layer of the counter electrode as previously described.

Note that no specific limitations are placed on the methods by which the conductive layer and the catalyst layer are formed, and known techniques may be adopted. For example, in a case in which the presently disclosed conductive film is used as the catalyst layer, the presently disclosed CNT water dispersion may be applied onto a support having a conductive layer such as an ITO film (i.e., applied onto the ITO film) and may then be dried so as to stack the support, the conductive layer (ITO film), and the catalyst layer in this order.

(Solar Cell)

The presently disclosed solar cell includes the presently disclosed electrode set forth above. The presently disclosed solar cell has excellent conversion efficiency as a result of including the presently disclosed electrode set forth above. More specifically, the presently disclosed solar cell has a structure in which a first electrode, an electrolyte layer, and a second electrode are in a stacked arrangement in stated order. The presently disclosed solar cell is, more specifically, preferably a dye-sensitized solar cell.

Although schematic structure of the presently disclosed solar cell is described below using, as an example, a case in which the solar cell is a dye-sensitized solar cell, the presently disclosed solar cell is not limited to the following example.

As illustrated in FIG. 1, a dye-sensitized solar cell 100 according to the present disclosure includes a photoelectrode 10, an electrolyte layer 20, and a counter electrode 30, and has the electrolyte layer 20 positioned between the photoelectrode 10 and the counter electrode 30. The photoelectrode 10 includes a support 10a, a conductive layer 10b disposed on the support 10a, a porous semiconductor fine particulate layer 10c formed of semiconductor fine particles, and a sensitizing dye layer 10d formed of a sensitizing dye that is adsorbed to the surfaces of the semiconductor fine particles in the porous semiconductor fine particulate layer 10c, and has the porous semiconductor fine particulate layer 10c and the sensitizing dye layer 10d formed on the conductive layer 10b. Moreover, the counter electrode 30 includes a support 30a, a conductive layer 30b disposed on the support 30a, and a catalyst layer 30c disposed on the conductive layer 30b. The conductive layer 10b of the photoelectrode 10 and the conductive layer 30b of the counter electrode 30 are connected via an external circuit 40.

<Photoelectrode and Counter Electrode>

The dye-sensitized solar cell that is an example of the presently disclosed solar cell includes the presently disclosed electrode set forth above as at least one of the photoelectrode 10 and the counter electrode 30. Moreover, the dye-sensitized solar cell preferably includes the presently disclosed conductive film as the catalyst layer 30c of the counter electrode 30 as previously described.

The photoelectrode 10 is an electrode that can release electrons to the external circuit upon receiving light. The photoelectrode 10 may, for example, include a support 10a, a conductive layer 10b disposed on the support, a porous semiconductor fine particulate layer 10c formed of semiconductor fine particles, and a sensitizing dye layer 10d formed of a sensitizing dye that is adsorbed to the surfaces of the semiconductor fine particles in the porous semiconductor fine particulate layer as previously described.

The support 10a and the conductive layer 10b of the photoelectrode may each be a known example thereof. More specifically, the support 10a of the photoelectrode can be the same as any of those previously described as the "support of the counter electrode", and the conductive layer 10b of the photoelectrode can be the same as any of those previously described as the "conductive layer of the counter electrode".

The porous semiconductor fine particulate layer 10c of the photoelectrode can be formed using particles of a metal oxide (semiconductor fine particles) such as titanium oxide, zinc oxide, or tin oxide, for example. One type of metal oxide particles may be used individually, or two or more types of metal oxide particles may be used in combination.

The porous semiconductor fine particulate layer 10c can be formed by pressing, hydrothermal decomposition, electrophoretic deposition, binder-free coating, or the like.

The sensitizing dye forming the sensitizing dye layer 10d that is adsorbed to the surfaces of the semiconductor fine particles in the porous semiconductor fine particulate layer 10c may be an organic dye such as a cyanine dye, a merocyanine dye, an oxonol dye, a xanthene dye, a squarylium dye, a polymethine dye, a coumarin dye, a riboflavin dye, or a perylene dye; a metal complex dye such as a phthalocyanine complex or porphyrin complex of a metal such as iron, copper, or ruthenium; or the like. One sensitizing dye may be used individually, or two or more sensitizing dyes may be used in combination.

Note that the sensitizing dye layer 10d can be formed by a method in which the porous semiconductor fine particulate layer 10c is immersed in a solution of the sensitizing dye, a method in which a solution of the sensitizing dye is applied onto the porous semiconductor fine particulate layer 10c, or the like, for example.

<Electrolyte Layer>

The electrolyte layer 20 typically contains a supporting electrolyte, a redox couple (i.e., a couple of chemical species that can be reversibly converted between in a redox reaction in the form of an oxidant and a reductant), a solvent, and so forth.

Examples of supporting electrolytes that may be used include salts having a cation such as a lithium ion, an imidazolium ion, or a quaternary ammonium ion. One of these supporting electrolytes may be used individually, or two or more of these supporting electrolytes may be used in combination.

The redox couple enables reduction of the oxidized sensitizing dye and examples thereof include chlorine compound/chlorine, iodine compound/iodine, bromine compound/bromine, thallium(III) ions/thallium(I) ions, ruthenium(III) ions/ruthenium(II) ions, copper(II) ions/copper(I) ions, iron(III) ions/iron(II) ions, cobalt(III) ions/cobalt(II) ions, vanadium(III) ions/vanadium(II) ions, manganic acid ions/permanganic acid ions, ferricyanide/ferrocyanide, quinone/hydroquinone, and fumaric acid/succinic acid. One of these redox couples may be used individually, or two or more of these redox couples may be used in combination.

Any of the previously described polar aprotic substances can be used as the solvent. One of these polar aprotic substances may be used individually, or two or more of these polar aprotic substances may be used in combination.

The electrolyte layer 20 can be formed by, for example, applying a solution (electrolyte solution) containing the constituent components of the electrolyte layer 20 onto the photoelectrode 10 or by preparing a cell including the photoelectrode 10 and the counter electrode 30 and then injecting the electrolyte solution into a gap between the electrodes.

(Method of Producing Solar Cell)

The presently disclosed method of producing a solar cell is a method of producing a solar cell having a first electrode, an electrolyte layer, and a second electrode in a stacked arrangement in stated order and includes a step of applying the presently disclosed CNT water dispersion set forth above onto a substrate and performing drying thereof to form a conductive film and form a first electrode that includes the conductive film and a step of using an electrolyte solution containing a polar aprotic substance as a solvent to form an electrolyte layer between the first electrode and a second electrode. Through the presently disclosed production method, it is possible to efficiently produce the presently disclosed solar cell having excellent conversion efficiency. As previously described, a polar aprotic substance can be used for the electrolyte solution, examples of which include five-membered-ring cyclic carbonates such as ethylene carbonate and propylene carbonate; five-membered-ring cyclic esters such as γ-butyrolactone and γ-valerolactone; aliphatic nitriles such as acetonitrile, 3-methoxypropionitrile, and methoxyacetonitrile; aliphatic chain ethers such as dimethoxyethane and triethylene glycol monomethyl ether; alicyclic ethers such as tetrahydrofuran and dioxane; aliphatic sulfones such as ethyl isopropyl sulfone; cyclic sulfones such as sulfolane; aliphatic sulfoxides such as dimethyl sulfoxide; dimethylformamide; and ethylmethylimidazolium bis(trifluoromethylsulfonyl)imide. Of these examples, acetonitrile, γ-butyrolactone, 3-methoxypropionitrile, and triethylene glycol monomethyl ether are preferable as the polar aprotic substance.

The dispersant that is contained in the presently disclosed CNT water dispersion is preferably soluble in the solvent (polar aprotic substance) that is contained in the electrolyte solution. When the dispersant that is contained in the CNT water dispersion is soluble in the solvent, it is possible to even further increase the photoelectric conversion efficiency of a solar cell because the dispersant, which constitutes a resistive component contained in a conductive film, elutes into the electrolyte solution inside the solar cell and thus can be removed from the conductive film.

It is also preferable that the presently disclosed CNT water dispersion further contains a thickener and that the thickener is insoluble in the solvent (polar aprotic substance) that is contained in the electrolyte solution. When a thickener that is contained in the CNT water dispersion is insoluble in the solvent that is a constituent of the electrolyte solution, the thickener displays binding capacity in a conductive film that is incorporated into a solar cell, inhibits detachment of the conductive film from a substrate, and, as a result, can improve the conversion efficiency of the solar cell.

(Solar Cell Module)

Presently disclosed solar cells such as described above can be connected in series and/or parallel so as to obtain a solar cell module.

For example, a solar cell module can be obtained by arranging presently disclosed solar cells on a flat plane or curved plane, providing non-conductive partitions between the cells, and electrically connecting photoelectrodes and counter electrodes of the cells using conductive members.

A solar cell module that includes the presently disclosed solar cell has excellent conversion efficiency and reliability.

Note that the number of solar cells used to form the solar cell module is not specifically limited and can be set as appropriate depending on the target voltage.

EXAMPLES

The following provides a more specific description of the present disclosure based on examples. However, the present disclosure is not limited to the following examples. In the following description, % and "parts" used in expressing quantities are by mass, unless otherwise specified. The following methods were used to perform evaluations in the present examples.

<External Appearance of Conductive Film (Pinholes)>

An arbitrary 1 cm$^2$ section of a conductive film of a counter electrode (PEN+ITO film+conductive film) was visually observed so as to confirm the presence or absence of pinholes of a size indicated below. An evaluation was made in accordance with the following standard. The absence of pinholes of larger size indicates that the conductive film has higher film strength.
- A: No formation of pin holes of 0.5 mm or larger
- B: Formation of pinholes of not smaller than 0.5 mm and smaller than 1.0 mm
- C: Formation of pinholes of 1.0 mm or larger <Catalytic Activity, Electrical Conductivity, and Conversion Efficiency>

A solar simulator (PEC-L11 produced by Peccell Technologies Inc.) in which an AM1.5G filter was attached to a 150 W xenon lamp light source was used as a light source. The light intensity was adjusted to 1 sun (AM1.5G, 100 mW/cm$^2$ [Class A of JIS C8912]). A produced dye-sensitized solar cell was connected to a sourcemeter (Series 2400 SourceMeter produced by Keithley Instruments) and the following current/voltage characteristic was measured.

Output current was measured while changing bias voltage from 0 V to 0.8 V in 0.01 V units under 1 sun photoirradiation. The output current was measured for each voltage step by, after the voltage had been changed, integrating values from 0.05 seconds after the voltage change to 0.15 seconds after the voltage change. Measurement was also performed while changing the bias voltage in the reverse direction from 0.8 V to 0 V, and an average value of measurements for the forward direction and the reverse direction was taken to be the photoelectric current.

The short-circuit current density (Jsc; units of mA/cm$^2$), the open-circuit voltage (Voc; units of V), the fill factor (FF; unitless), and the energy conversion efficiency (η; units of %) were calculated from measurement results of the current/voltage characteristic described above. A value for the short-circuit current density (Jsc; units of mA/cm$^2$) corresponds to catalytic activity of a conductive film, whereas a value for the fill factor (FF; unitless) corresponds to the electrical conductivity of the conductive film. The catalytic activity, electrical conductivity, and conversion efficiency were evaluated in accordance with the following standards.

<<Catalytic Activity>>
- A: 10.0 or more
- B: Not less than 9.0 and less than 10.0
- C: Less than 9.0

<<Electrical Conductivity>>
- A: 0.60 or more
- B: Not less than 0.55 and less than 0.60
- C: Less than 0.55

<<Conversion Efficiency>>
- A: 4.0 or more
- B: Not less than 3.5 and less than 4.0
- C: Less than 3.5

<G/D Ratio>

A microscopic laser Raman spectrophotometer (Nicolet Almega XR produced by Thermo Fisher Scientific) was used to measure a Raman spectrum for fibrous carbon nanostructures. The intensity of a G band peak observed at around 1590 cm$^{-1}$ and the intensity of a D band peak observed at around 1340 cm$^{-1}$ were determined for the obtained Raman spectrum, and a G/D ratio was calculated.

Example 1

<Production of CNT Water Dispersion>

A mixture was obtained by charging a 500 mL plastic bottle with 2.0 g of single-walled CNTs (produced by Zeon Corporation; product name: SG101; BET specific surface area: 1,264 m$^2$/g; G/D ratio: 3.8), 2.0 g of acetylene black (DENKA BLACK® HS-100 (DENKA BLACK is a registered trademark in Japan, other countries, or both) produced by Denka Company Limited; average particle diameter: 48 nm; BET specific surface area: 39 m$^2$/g), 5.0 g (250 parts per 100 parts of single-walled CNTs) in terms of pure content of a copolymer of styrene and methoxy polyethylene glycol methacrylate (produced by Kusumoto Chemicals, Ltd.; product name: DISPARLON® AQ-380 (DISPARLON is a registered trademark in Japan, other countries, or both); soluble in acetonitrile; weight-average molecular weight: 15,000; n of ethylene glycol chain section $(CH_2-CH_2-O)_n$: 23) as a dispersant, 1.0 g (50 parts per 100 parts of single-walled CNTs) of hydroxyethyl cellulose (produced by Daicel FineChem Ltd.; product name: SP600; insoluble in acetonitrile) as a thickener, and 400 g of pure water.

The obtained mixture was stirred by a Homo Mixer at 6,000 rpm for 30 minutes while cooling the plastic bottle to 25° C. in a water bath so as to obtain a crude dispersion.

The obtained crude dispersion was then subjected to 10 passes of treatment at 100 MPa in a wet jet mill (produced by Yoshida Kikai Co., Ltd.; product name: NanoVater® (NanoVater is a registered trademark in Japan, other countries, or both)) while being cooled to 25° C. so as to obtain a CNT water dispersion.

<Production of Counter Electrode>

The CNT water dispersion produced as described above was applied onto ITO-PEN film (50 mm×50 mm, 15 Ω/sq.) by screen printing using a 100-mesh screen and was then dried in an air atmosphere at 125° C. for 15 minutes using an inert oven (produced by Yamato Scientific Co., Ltd.) so as to form a coating film. The coating film was dried under conditions of 2 hours at 60° C. under reduced pressure so as to produce a counter electrode that included a support formed of polyethylene naphthalate, an ITO film as a conductive layer, and the presently disclosed conductive film as a catalyst layer, in this order. This counter electrode was used to evaluate external appearance (film strength) of the conductive film. The result is shown in Table 1.

<Production of Photoelectrode>

A sensitizing dye solution (concentration: 0.3 mM) was prepared using a ruthenium complex (produced by Solaronix; product name: N719) as a sensitizing dye and ethanol as a solvent.

An isopropyl alcohol solution of titanium isopropoxide with a concentration of 5 mM was applied onto ITO-PEN film (50 mm×50 mm, 15 Ω/sq.) by bar coating and was then dried at 150° C. in an inert oven (produced by Yamato Scientific Co., Ltd.) for 15 minutes. A heat curable Ag paste (produced by Toyochem Co., Ltd.) was used to perform printing using a screen printing machine (SFA-PC610CTN produced by Seria Corporation) and was heated at 130° C. in an inert oven (produced by Yamato Scientific Co., Ltd.) for 30 minutes to form a lead-out electrode (thickness: 8 μm). In addition, an aqueous titanium oxide paste (PECC-AW1-01 produced by Peccell Technologies, Inc.) was applied by the screen printing machine and was then dried at 150° C. in an inert oven (produced by Yamato Scientific Co., Ltd.) for 15 minutes to form a porous semiconductor layer (titanium oxide layer thickness: 8 μm).

The ITO-PEN film with the porous semiconductor layer formed thereon was placed in the sensitizing dye solution (50 cm-square vat) that was produced as described above and was immersed therein at 40° C. for 2 hours. After this immersion, washing was performed using ethanol solution, and then drying was performed under reduced pressure at 40° C. for 24 hours to produce a photoelectrode.

<Production of Solar Cell>

An electrolyte solution was obtained by dissolving 0.05 mol/L of iodine, 0.1 mol/L of lithium iodide, 0.5 mol/L of t-butylpyridine, and 0.6 mol/L of 1,2-dimethyl-3-propylimidazolium iodide in acetonitrile as a solvent.

Inside a vacuum bonding apparatus, a sealant (polybutylene photocurable resin and 8 mass % of 25 μm insulating spacer resin) was applied onto the photoelectrode by a dispenser such as to pass around the perimeter of the photoelectrode once with a sealant width of 0.9 mm and height of 30 μm after bonding, and then the electrolyte solution obtained as described above was applied onto the photoelectrode. Bonding was then performed by setting up the counter electrode inside the vacuum bonding apparatus, performing overlapping thereof under vacuum, and then curing the sealant through UV irradiation by a metal halide lamp with an integrated light intensity of 3,000 mJ/cm$^2$. The vacuum was then released to atmospheric pressure to produce a dye-sensitized solar cell as a solar cell. This solar cell was used to evaluate catalytic activity, electrical conductivity, and conversion efficiency. The results are shown in Table 1.

Example 2

Various operations and evaluations were performed in the same way as in Example 1 with the exception that the amount of acetylene black was halved in production of the CNT water dispersion so as to change the mass ratio of acetylene black/single-walled carbon nanotubes to 0.5. The results are shown in Table 1.

Example 3

Various operations and evaluations were performed in the same way as in Example 1 with the exception that 0.4 g of acetylene black (DENKA BLACK® FX-35 produced by Denka Company Limited; average particle diameter: 23 nm; BET specific surface area: 133 m$^2$/g) was compounded in production of the CNT water dispersion such that the mass ratio of acetylene black/single-walled carbon nanotubes was 0.2. The results are shown in Table 1.

Example 4

Various operations and evaluations were performed in the same way as in Example 1 with the exception that 2.0 g of single-walled CNTs (TUBALL® (TUBALL is a registered trademark in Japan, other countries, or both) produced by Kusumoto Chemicals, Ltd.; BET specific surface area: 1,192 m$^2$/g; G/D ratio: 62.8) were compounded. The results are shown in Table 1.

Comparative Example 1

Various operations and evaluations were performed in the same way as in Example 1 with the exception that acetylene black was not compounded. The results are shown in Table 1.

Comparative Example 2

Various operations and evaluations were performed in the same way as in Example 1 with the exception that the amount of acetylene black was changed to 3.0 g such that the mass ratio of acetylene black/single-walled carbon nanotubes was 1.5. The results are shown in Table 1.

Comparative Example 3

Various operations and evaluations were performed in the same way as in Example 2 with the exception that Ketjenblack (CARBON ECP produced by Lion Specialty Chemicals Co., Ltd.; average particle diameter: 30 nm; BET specific surface area: 800 m$^2$/g) was compounded instead of acetylene black. The results are shown in Table 1.

Comparative Example 4

Various operations and evaluations were performed in the same way as in Example 1 with the exception that 2.0 g of multi-walled CNTs (K-nanos produced by KUMHO; BET specific surface area: 245 m$^2$/g; G/D ratio: 0.8) were compounded instead of single-walled CNTs. The results are shown in Table 1.

Comparative Example 5

Various operations and evaluations were performed in the same way as in Example 1 with the exception that 2.0 g of multi-walled CNTs (NC7000 produced by Nanocyl; BET specific surface area: 234 m$^2$/g; G/D ratio: 0.6) were compounded instead of single-walled CNTs. The results are shown in Table 1.

In Table 1, shown below:
- "SGCNT" indicates "SG101" single-walled CNTs produced by Zeon Corporation;
- "Tuball" indicates "TUBALL©" single-walled CNTs produced by Kusumoto Chemicals, Ltd.;
- "K-nanos" indicates "K-nanos" multi-walled CNTs produced KUMHO;
- "NC7000" indicates "NC7000" multi-walled CNTs produced by Nanocyl;
- "HS-100" indicates "DENKA BLACK® HS-100" acetylene black produced by Denka Company Limited;
- "FX-35" indicates "DENKA BLACK® FX-35" acetylene black produced by Denka Company Limited; and
- "ECP" indicates "CARBON ECP" Ketjenblack produced by Lion Specialty Chemicals Co., Ltd.

TABLE 1

| | | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|---|
| CNT water dispersion | CNTs (A) | SGCNT | SGCNT | SGCNT | Tuball | SGCNT | SGCNT | SGCNT | K-nanos | NC7000 |
| | Type of (A) | Single-walled | Single-walled | Single-walled | Single-walled | Single-walled | Single-walled | Single-walled | Multi-walled | Multi-walled |
| | Carbon black (B) | HS-100 | HS-100 | FX-35 | HS-100 | — | HS-100 | ECP | HS-100 | HS-100 |

TABLE 1-continued

|  |  | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|---|
|  | Type of (B) | Acetylene black | Acetylene black | Acetylene black | Acetylene black | — | Acetylene black | Ketjenblack | Acetylene black | Acetylene black |
|  | Mass ratio (B/A) | 1.0 | 0.5 | 0.2 | 1.0 | — | 1.5 | 0.5 | 1.0 | 1.0 |
| Conductive film | External appearance (pinholes) | A | A | A | A | A | B | C | A | A |
|  | Catalytic activity (Jsc) | A | A | A | A | A | B | A | C | C |
|  | Electrical conductivity (FF) | A | A | A | A | B | A | B | A | A |
|  | Conversion efficiency | A | A | A | A | B | B | B | C | C |

It can be seen from Table 1 that it was possible to form a conductive film that had excellent electrical conductivity, that had excellent catalytic activity when used as a catalyst layer, and that could cause a solar cell to display excellent conversion efficiency by using the CNT water dispersions of Examples 1 to 4.

INDUSTRIAL APPLICABILITY

According to the present disclosure, it is possible to provide a carbon nanotube water dispersion with which it is possible to form a conductive film that has excellent electrical conductivity, that has excellent catalytic activity when used as a catalyst layer, and that can cause a solar cell to display excellent conversion efficiency.

Moreover, according to the present disclosure, it is possible to provide a conductive film that has excellent electrical conductivity, that has excellent catalytic activity when used as a catalyst layer, and that can cause a solar cell to display excellent conversion efficiency.

Furthermore, according to the present disclosure, it is possible to provide an electrode that can cause a solar cell to display excellent conversion efficiency.

Also, according to the present disclosure, it is possible to provide a solar cell having excellent conversion efficiency.

REFERENCE SIGNS LIST 10 photoelectrode
30 counter electrode
20 electrolyte layer
10a, 30a support
10b, 30b conductive layer
10c porous semiconductor fine particulate layer
10d sensitizing dye layer
30c catalyst layer
40 circuit
100 dye-sensitized solar cell

The invention claimed is:

1. A carbon nanotube water dispersion comprising: one or more single-walled carbon nanotubes; acetylene black; a dispersant; and water, wherein a content ratio of the single-walled carbon nanotubes and the acetylene black, in terms of a mass ratio of acetylene black/single-walled carbon nanotubes, is 1.4 or less, and wherein a content of the dispersant per 100 parts by mass of the single-walled carbon nanotubes is 50 parts by mass or more, a content of the single-walled carbon nanotubes in the carbon nanotube water dispersion is 0.5 mass % or more, BET specific surface area of the single-walled carbon nanotubes is 400 $m^2/g$ or more and 1,600 $m^2/g$ or less and BET specific surface area of the acetylene black is 30 $m^2/g$ or more and 150 $m^2/g$ or less.

2. The carbon nanotube water dispersion according to claim 1, further comprising a thickener.

3. The carbon nanotube water dispersion according to claim 2, wherein the dispersant and the thickener are each formed of a non-ionic polymer.

4. The carbon nanotube water dispersion according to claim 1, wherein the dispersant is a copolymer of styrene and methoxy polyethylene glycol methacrylate.

5. A conductive film obtained using the carbon nanotube water dispersion according to claim 1.

6. An electrode comprising the conductive film according to claim 5.

7. The electrode according to claim 6, wherein the electrode is a counter electrode.

8. A solar cell comprising the electrode according to claim 6.

9. A method of producing a solar cell having a first electrode, an electrolyte layer, and a second electrode in a stacked arrangement in stated order, comprising:

a step of applying the carbon nanotube water dispersion according claim 1 onto a substrate and performing drying thereof to form a conductive film and form a first electrode that includes the conductive film; and a step of using an electrolyte solution containing a polar aprotic substance as a solvent to form an electrolyte layer between the first electrode and a second electrode.

10. The method of producing a solar cell according to claim 9, wherein the dispersant that is contained in the carbon nanotube water dispersion is soluble in the solvent that is contained in the electrolyte solution.

11. The method of producing a solar cell according to claim 9, wherein the carbon nanotube water dispersion further contains a thickener, and the thickener is insoluble in the solvent that is contained in the electrolyte solution.

12. The method of producing a solar cell according to claim 9, wherein the polar aprotic substance is one or more selected from the group consisting of acetonitrile, γ-butyrolactone, 3-methoxypropionitrile, and triethylene glycol monomethyl ether.

* * * * *